United States Patent
Lee (10) Patent No.: US 9,214,501 B2
(45) Date of Patent: Dec. 15, 2015

(54) IN-CELL OLED TOUCH DISPLAY PANEL STRUCTURE

(71) Applicant: SuperC-Touch Corporation, New Taipei (TW)

(72) Inventor: Hsiang-Yu Lee, New Taipei (TW)

(73) Assignee: MEI, INC., Malvern, PA (US)

( * ) Notice: Subject to any disclaimer, the term of this patent is extended or adjusted under 35 U.S.C. 154(b) by 0 days.

(21) Appl. No.: 14/457,449

(22) Filed: Aug. 12, 2014

(65) Prior Publication Data
US 2014/0346493 A1    Nov. 27, 2014

Related U.S. Application Data

(63) Continuation-in-part of application No. 13/795,788, filed on Mar. 12, 2013.

(30) Foreign Application Priority Data

Mar. 13, 2012  (TW) .............................. 101204479 U
Aug. 13, 2013  (TW) .............................. 102215172 U (51) Int. Cl.
*H01L 27/32*    (2006.01)
*G06F 3/041*    (2006.01)
*G06F 3/044*    (2006.01)
*H01L 51/52*    (2006.01)

(52) U.S. Cl.
CPC .............. *H01L 27/323* (2013.01); *G06F 3/044* (2013.01); *G06F 3/0412* (2013.01); *H01L 51/5284* (2013.01)

(58) Field of Classification Search
CPC ... H01L 27/323; H01L 27/3276; G06F 3/044; G06F 3/0412; G02F 1/13338
USPC ........................................................ 362/231
See application file for complete search history.

(56) References Cited

U.S. PATENT DOCUMENTS

| 7,196,281 B2 * | 3/2007 | Cok et al. ...................... 200/512 |
| 9,019,215 B2 * | 4/2015 | Hwang et al. .................. 345/173 |
| 2007/0063985 A1 * | 3/2007 | Yamazaki et al. ............ 345/173 |

(Continued)

FOREIGN PATENT DOCUMENTS

TW           M441878 U1    11/2012

OTHER PUBLICATIONS

WO/2012/121517 to Lee, "Voltage Fluctuation-based Capacitive Touch Detection Means, Detection Method and Touch Screen Panel and Display Device with Built-in Capacitive Touch Screen Panel," Date Published Sep. 13, 2012.

*Primary Examiner* — Tracie Y Green
(74) *Attorney, Agent, or Firm* — Muncy, Geissler, Olds & Lowe, P.C.

(57) ABSTRACT

An in-cell OLED touch display panel structure includes an upper substrate, a lower substrate, an OLED layer configured between the upper and lower substrates, and a black matrix layer. The black matrix layer is disposed at one surface of the upper substrate that faces the OLED layer, and the black matrix layer is composed of a plurality of opaque conductor lines. The plurality of opaque conductor lines is divided into a first group of opaque conductor lines, a second group of opaque conductor lines, and a third group of opaque conductor lines. The second group of opaque conductor lines is formed with N mesh-like polygonal regions. The opaque conductor lines in any one of the polygonal regions are electrically connected together, while any two polygonal regions are not connected, so as to form a single-layered touch sensing pattern on the black matrix layer.

11 Claims, 7 Drawing Sheets

(56) References Cited

U.S. PATENT DOCUMENTS

| | | | |
|---|---|---|---|
| 2010/0007632 A1* | 1/2010 | Yamazaki | 345/175 |
| 2012/0105337 A1 | 5/2012 | Jun et al. | |
| 2012/0162584 A1 | 6/2012 | Chang et al. | |
| 2013/0044074 A1 | 2/2013 | Park et al. | |
| 2013/0242211 A1* | 9/2013 | Lee | 349/12 |
| 2013/0335376 A1 | 12/2013 | Lee | |

* cited by examiner

IN-CELL OLED TOUCH DISPLAY PANEL STRUCTURE

CROSS REFERENCE TO RELATED APPLICATION

This application claims the benefits of the Taiwan Patent Application Serial Number 102215172, filed on Aug. 13, 2013, the subject matter of which is incorporated herein by reference.

This application is a continuation-in-part (CIP) of U.S. Patent application for an "in-cell touch display panel structure", U.S. application Ser. No. 13/795,788, filed on Mar. 12, 2013.

BACKGROUND OF THE INVENTION

1. Field of the Invention

The present invention relates to a structure of touch display panel and, more particularly, to an in-cell OLED touch display panel structure.

2. Description of Related Art

Among many types of flat panel displays, the organic light emitting diode display (OLED) technology is the one with great potential. OLED was first published by Eastman Kodak Co. in 1987. It has the features of thinness, light weight, self-illumination, low driving voltage, high efficiency, high contrast, high color saturation, fast response, flexibility, etc., and is therefore deemed as positively evaluated display technology following the TFT-LCD.

In recent years, due to the development of mobile communications, digital products and digital televisions, the demand for high-quality full-color flat-panel displays is rapidly increased. The OLED display is provided with not only the advantages of LCD display including thinness, power-saving, and full-color display, but also the features of wide viewing angle, self-illumination, and fast response that are better than LCD.

Figure 1:
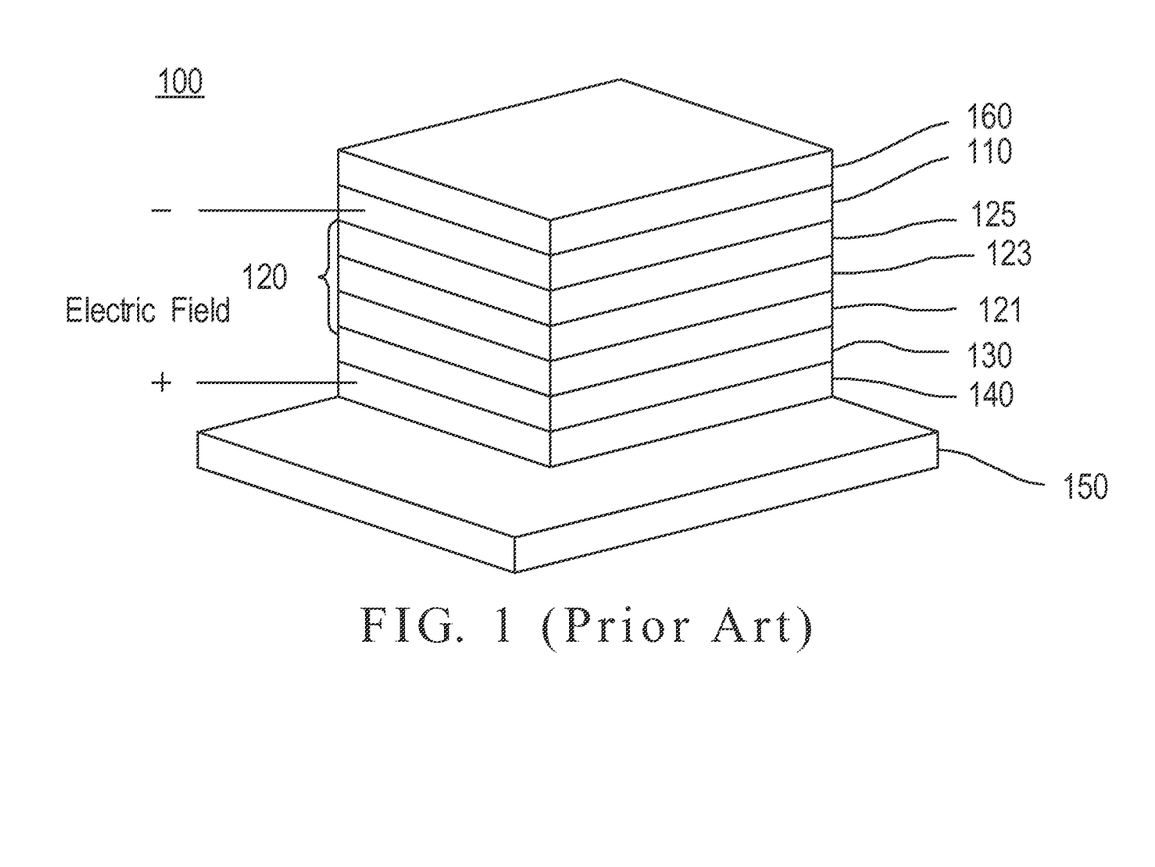
FIG. 1 schematically illustrates the basic structure of prior OLED display.

FIG. 1 schematically illustrates the basic structure of prior OLED display. The OLED display 100 includes a cathode layer 110, an OLED layer 120, an anode layer 130, a thin film transistor layer 140, a lower substrate 150, and an upper substrate 160, wherein the OLED layer 120 further includes a hole transporting layer (HTL) 121, an emitting layer 123, and an electron transporting layer (ETL) 125.

The light-emitting principle of OLED is such that the electrons and electric holes are injected from the cathode layer 110 and the anode layer 130 respectively by applying electric field and, after the electric holes pass through the electric hole transport sub-layer 121 and electrons pass through the electron transport sub-layer 125, the electrons and electric holes enter the light-emitting layer 123 with fluorescent characteristics and then are combined to produce excited photons, which immediately release energy and return to the ground state. The released energy will generate different colors of light based on different luminescent materials, so as to cause OLED to emit light.

Full-color OLED display method can be divided into RGB pixels placement method, color conversion method, color filter method, micro resonant tone color method, multi-layer stacking method, and so on. The principle of the color filter method of OLED is the same with that of the full-color LCD display method, except that it just uses white OLED light and uses color filters to filter out red, blue, and green primary colors. Due to the use of a single OLED light source, the lifetime of the red, blue and green primary colors is the same and thus there is no color distortion phenomenon. Moreover, it can be combined with the mature color filter technology for mass production. Thus, many manufacturers adopt the color filter method as the method of full-color OLED display.

The conventional touch display panel includes a touch panel and a display unit overlapped with the touch panel. The touch panel is configured as an operation interface. The touch panel is transparent so that an image generated by the display unit can be viewed directly by a user without being sheltered by the touch panel. Such well known skill of the touch panel may increase additional weight and thickness of the touch display panel, and may further reduce the light penetration rate, and increase reflectance and haze of the touch display panel.

On-cell and in-cell touch technology are invented to overcome the drawbacks of traditional touch technology described above. The on-cell technology is to dispose a touch sensor on a thin film and then bond the thin film onto the upper side of the upper glass substrate layer. The in-cell touch technology is provided to integrate the touch sensor within the display unit so that the display unit is provided with the ability of the touch panel. Therefore, the touch display panel does not need to be bonded with an additional touch panel so as to simplify the assembly procedure. Such skill is generally developed by display panel manufactures.

For the on-cell touch technology, it needs a sensing layer to be configured on an upper glass substrate or needs to use an upper substrate to increase touch sensing electrode, which not only increases the manufacturing cost but also complicates the manufacturing process, and which may also lower the aperture ratio and thus increase the manufacturing cost. Therefore, it desired for the aforementioned OLED touch display panel structure to be improved.

SUMMARY OF THE INVENTION

The object of the present invention is to provide an in-cell OLED touch display panel structure capable of significantly decreasing the thickness and weight of the OLED touch display panel, greatly saving the material cost and reducing the manufacturing cost.

To achieve the object, there is provided an in-cell OLED touch display panel structure, which comprises: an upper substrate; a lower substrate parallel to the upper substrate; an OLED layer configured between the upper substrate and the lower substrate; a black matrix layer disposed at one surface of the upper substrate and facing the OLED layer, the black matrix layer being composed of a plurality of opaque conductor lines; a thin film transistor layer disposed at the surface of the lower substrate facing the OLED layer, wherein, the plurality of opaque conductor lines are divided into a first group of opaque conductor lines, a second group of opaque conductor lines, and a third group of opaque conductor lines, the second group of opaque conductor lines being formed with N polygonal regions, where N is a positive integer, the opaque conductor lines in any one of the polygonal regions being electrically connected together while any two polygonal regions are not connected, so as to form a single-layered touch pattern on the black matrix layer.

DETAILED DESCRIPTION OF THE PREFERRED EMBODIMENT

Figure 2:
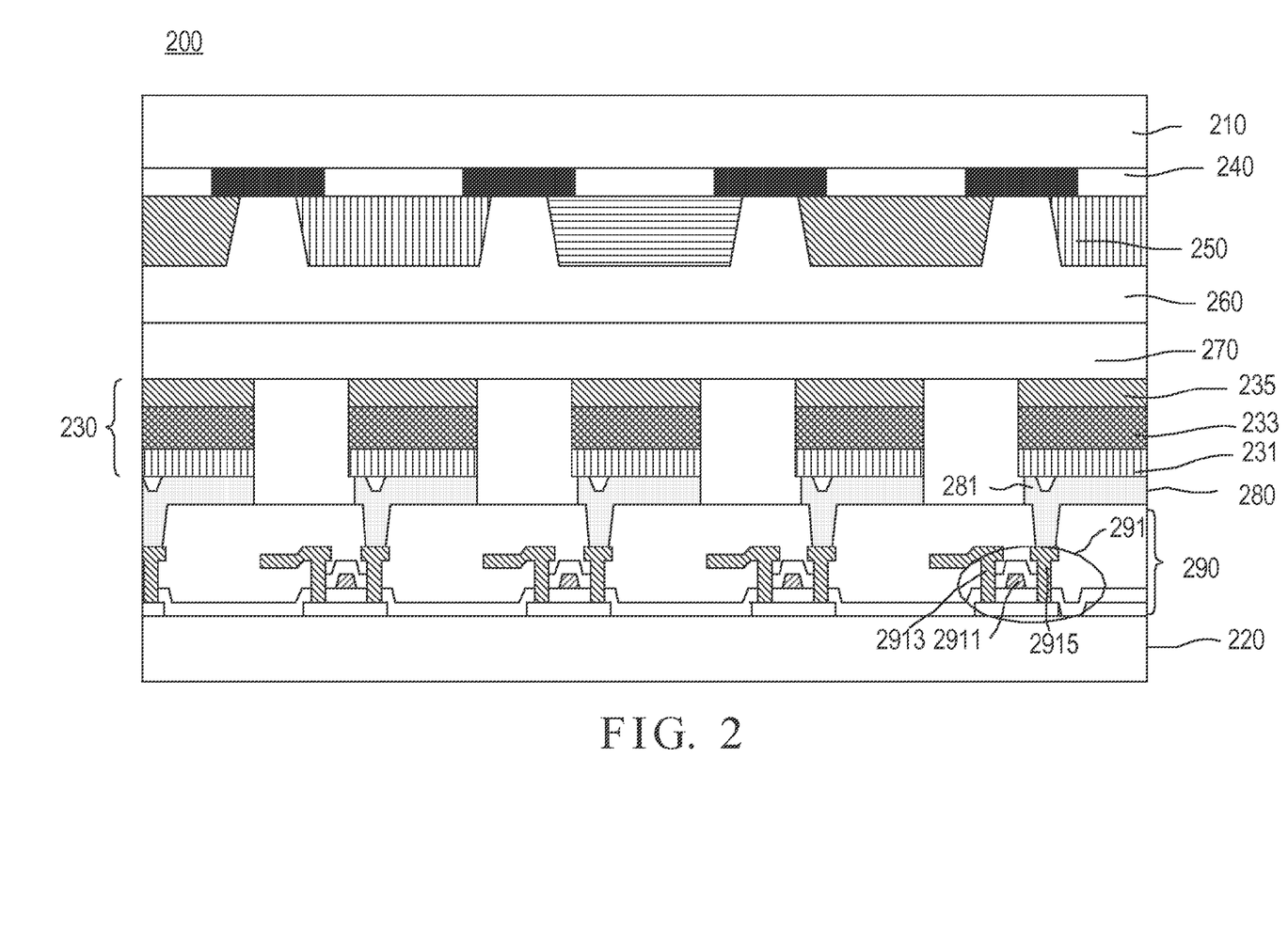
FIG. 2 is a stack-up diagram of the in-cell OLED touch display panel structure in accordance with the present invention.

FIG. 2 is the stack-up diagram of an in-cell OLED touch display panel structure 200 in accordance with the present invention. As shown, the in-cell OLED touch display panel structure 200 includes an upper substrate 210, a lower substrate 220, an OLED layer 230, a black matrix layer 240, a color filter layer 250, an over coating layer 260, a cathode layer 270, an anode layer 280, and a thin film transistor (TFT) layer 290.

The upper substrate 210 and the lower substrate 220 are preferably glass substrates or plastic substrates, and are parallel to each other. The OLED layer 230 is disposed between the upper and lower substrates 210, 220.

The black matrix layer 240 is disposed at one surface of the upper substrate 210 that faces the OLED layer 230, and the black matrix layer 240 is composed of a plurality of opaque conductor lines.

Figure 3:
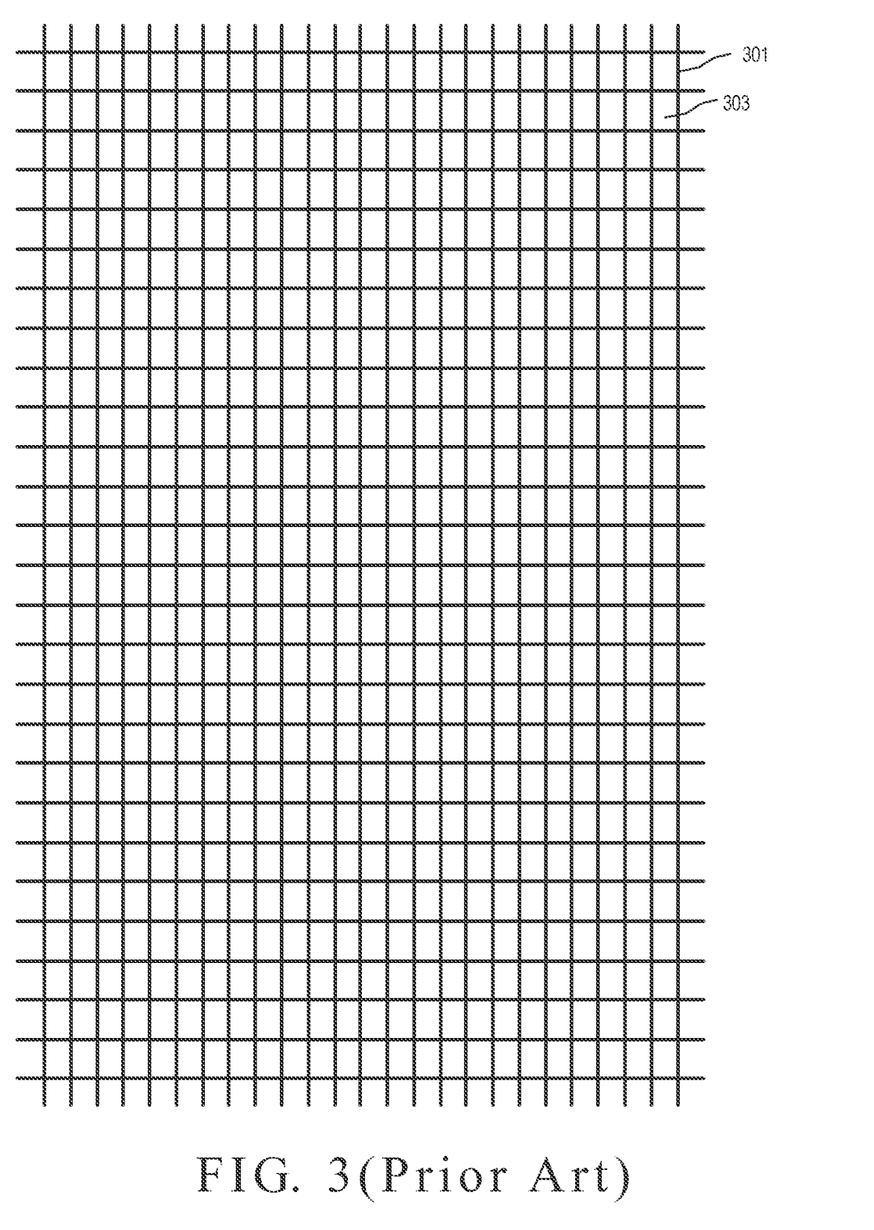
FIG. 3 shows a prior black matrix layer.

FIG. 3 shows a prior black matrix layer. As shown in FIG. 3, the prior black matrix layer is composed of lines of insulating material that are black and opaque. The lines 301 of black insulating material are arranged as a checkerboard pattern and a color filter is disposed in the areas 303 among the lines of black insulating material.

In the present invention, the opaque black insulating material of the black matrix layer are replaced by opaque conductive material, and a touch sensing pattern structure is formed on the black matrix layer. Therefore, there is no need to dispose a sensing electrode layer (ITO) on the upper substrate 210 or the lower substrate 220 of the OLED panel, thereby saving the manufacturing cost simplifying the assembly procedure, and further improving the panel yield.

Figure 4:
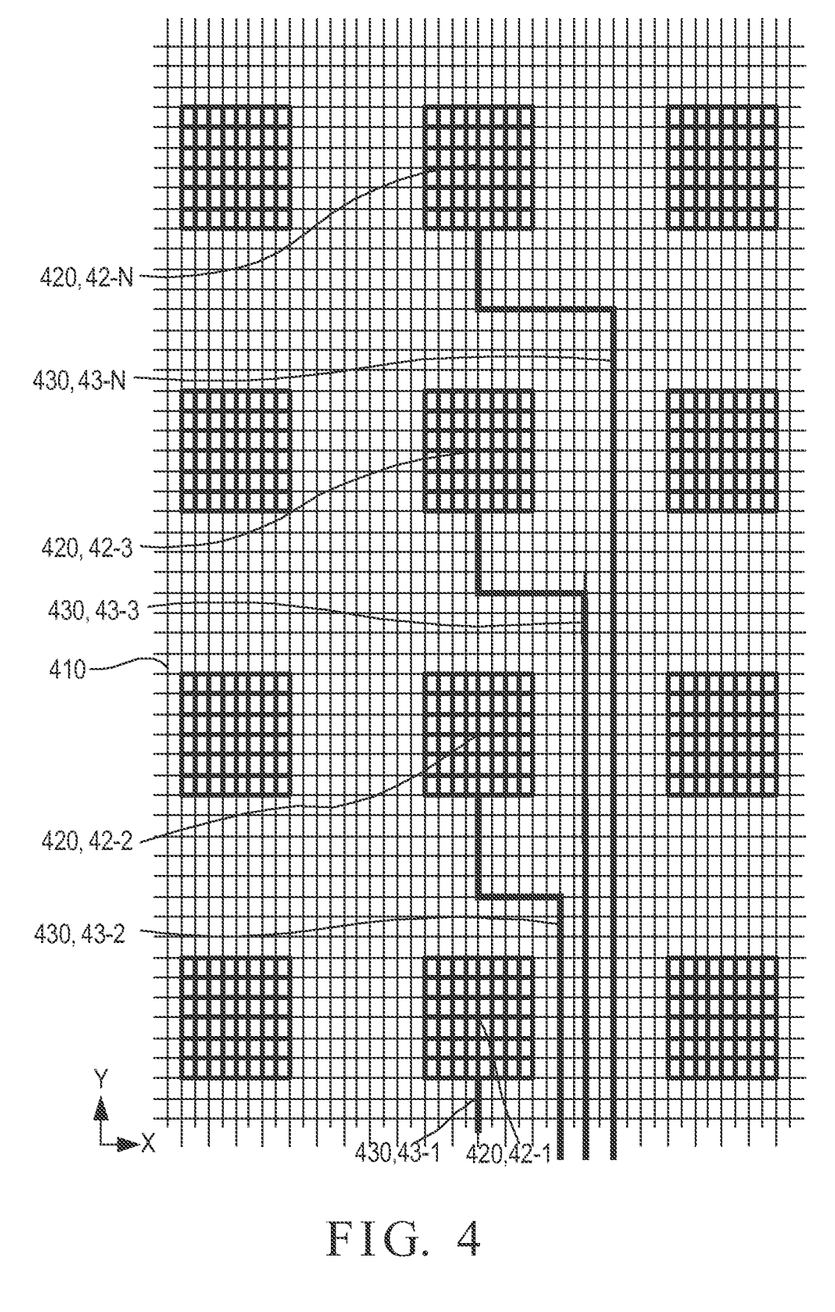
FIG. 4 is a schematic diagram of the black matrix layer in accordance with the present invention.

FIG. 4 is a schematic diagram of the black matrix layer 240 in accordance with the present invention. As shown in FIG. 4, the black matrix layer 240 is composed of a plurality of opaque conductor lines. The opaque conductor lines of the black matrix layer 240 are arranged in vertical and horizontal direction and they are across each other.

The opaque conductor lines of the black matrix 240 are made of material having characteristics of opaque and electric conduction. In this embodiment, the opaque conductor lines are made of black conductive material or combination of opaque non-conductive material and conductive metal material; wherein, the black conductive material is chromium, the opaque non-conductive material is black resin, the conductive metal material is selectively to be chromium, barium, aluminum, silver, copper, titanium, nickel, tantalum, cobalt, tungsten, magnesium, calcium, potassium, lithium, indium, or their alloy.

The plurality of opaque conductor lines are divided into a first group of opaque conductor lines 410, a second group of opaque conductor lines 420, and a third group of opaque conductor lines 430.

The second group of opaque conductor lines 420 is formed with N mesh-like polygonal regions denoted by numerals 42-1 to 42-N, where N is a positive integer. The opaque conductor lines in any one of the mesh-like polygonal regions are electrically connected together, while any two mesh-like polygonal regions are not electrically connected, so as to form a single-layered touch sensing pattern on the black matrix layer 240. Each of the mesh-like polygonal regions 42-1 to 42-N may be formed in a triangle, rectangle, square, rhombus, hexagon, octagon, or round shape. In this embodiment, the mesh-like polygonal regions 42-1 to 42-N are formed in rectangle shapes.

The third group of opaque conductor lines 430 is formed with N conductive traces denoted by numerals 43-1 to 43-N, where N is a positive integer. Each of the N conductive traces is electrically connected to a corresponding mesh-like polygonal region 42-1 to 42-N, i.e., the conductive traces 43-1 to 43-N are electrically connected to the mesh-like polygonal regions 42-1 to 42-N, respectively, while any two conductive traces 43-1 to 43-N are not electrically connected. The first group of opaque conductor lines 410 is not electrically connected with the second group of opaque conductor lines 420 and the third group of opaque conductor lines 430.

Figure 5:
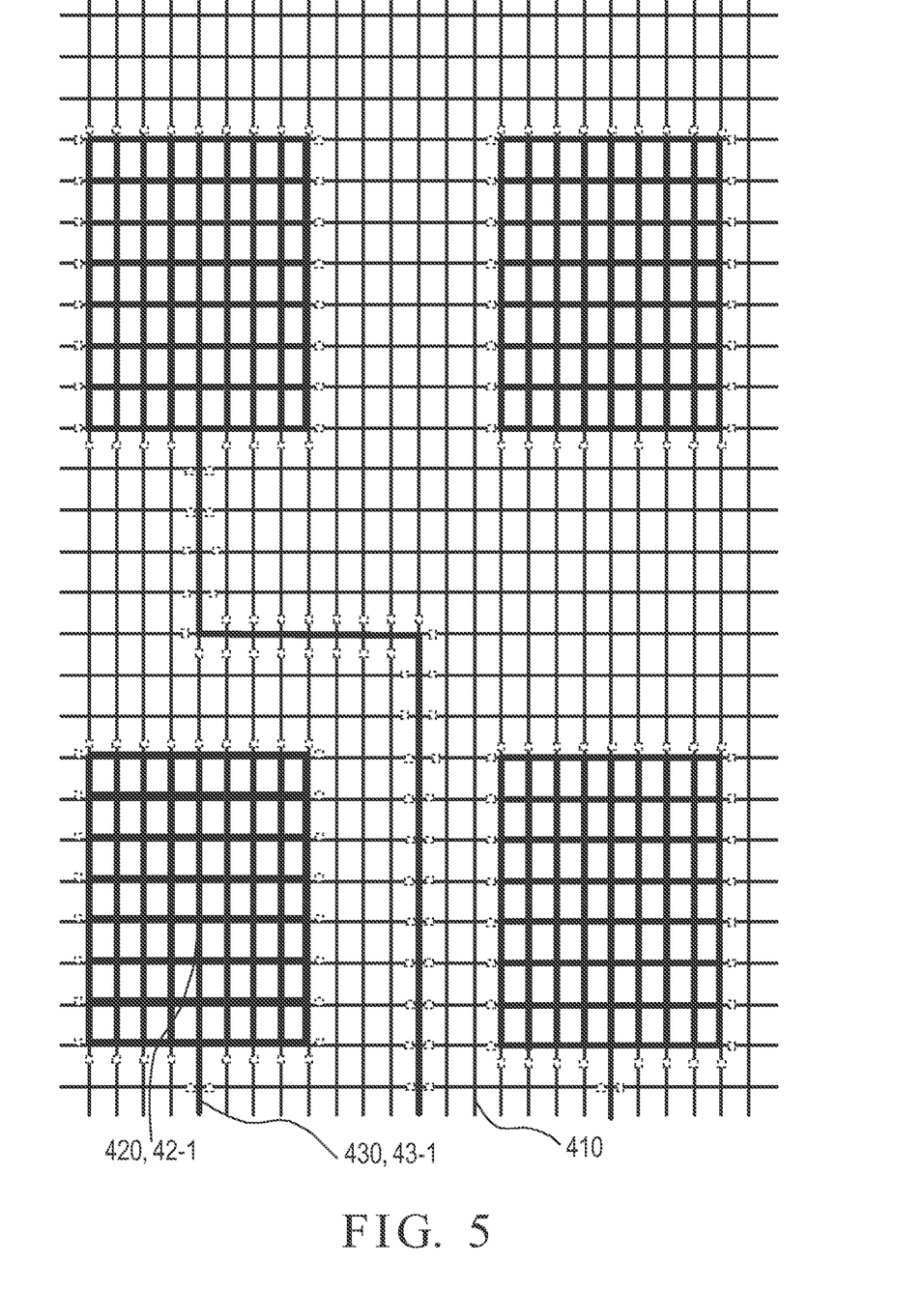
FIG. 5 is a detail view of the black matrix layer in accordance with the present invention.

FIG. 5 is a detail view of the black matrix layer 240 in accordance with the present invention. As shown in FIG. 5, the first group of opaque conductor lines 410 is spaced apart from (i.e., not electrically connected to) the second group of opaque conductor lines 420 and the third group of opaque conductor lines 430. In other words, the first group of opaque conductor lines 410 and the second groups of opaque conductor lines 420 are not connected by cutting off opaque conductor lines, as indicated by small squares in FIG. 5, in the prior black matrix layer. Similarly, the first group of opaque conductor lines 410 and third group of opaque conductor lines 430 are not connected by cutting off conductor lines, as indicated by small squares in FIG. 5, in the prior black matrix layer. Therefore, the second group of opaque conductor lines 420 can be formed with a single-layered touch sensing pattern on the black matrix layer 240. It is noted that cutting the conductive lines herein does not mean to first form the prior black matrix layer and then cut off corresponding conductive lines. Instead, when proceeding with mask layout of the black matrix 240, the first group of opaque conductor lines 410 and the second group of opaque conductor lines 420 are formed by using layout tools, such as Laker or Virtuso, to allow the mask to be capable of spacing the first group of opaque conductor lines 410, the second group of opaque conductor lines 420 and the third group of opaque conductor lines 430 from one another. Accordingly, there is no additional procedure required in the OLED manufacturing process.

Figure 6:
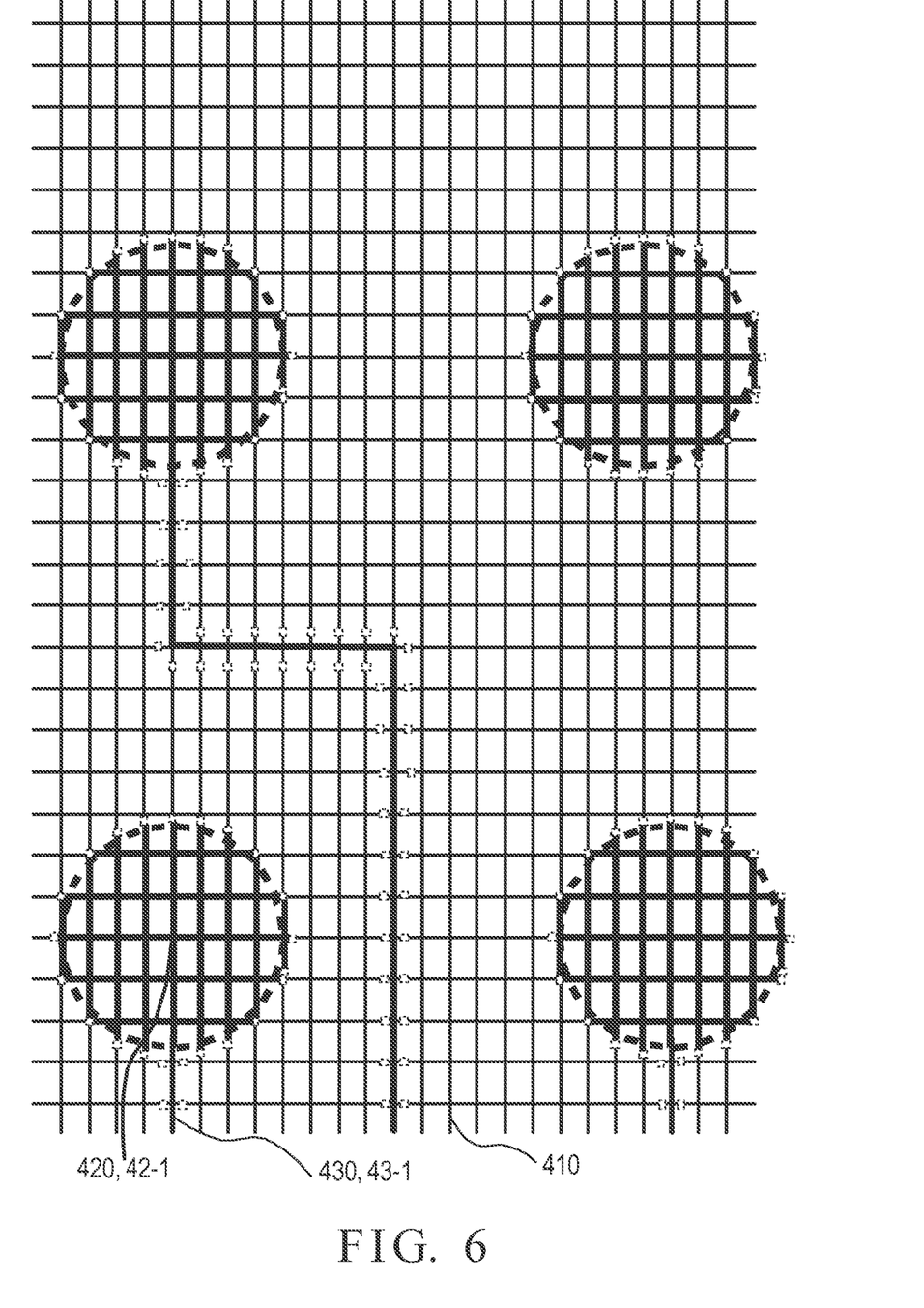
FIG. 6 is another detail view of the black matrix layer in accordance with the present invention.

FIG. 6 is another detail view of the black matrix layer 240 in accordance with the present invention. As shown in FIG. 6, the N mesh-like polygonal regions 42-1 to 42-N are formed in round shapes that are deemed as the mesh-like polygonal regions with infinite number of edges.

The color filter layer 250 is disposed among the plurality of opaque conductor lines of the black matrix layer 240 and on the surface of the plurality of opaque conductor lines.

The over coating layer 260 is disposed on the surface of the color filter layer 250.

The thin film transistor layer 290 is disposed at one side of the lower substrate 220 that faces the OLED layer 230. The thin film transistor layer 290 includes K gate lines and L source lines, wherein K and L are positive integers. The gate lines and source lines are well-known to those skilled in the art of display panel, and thus are not shown in the figures. Based on a display pixel signal and a display driving signal, a corresponding pixel driving circuit 291 is driven so as to proceed with display operation. The K gate lines and the L source lines are disposed at positions corresponding to the positions of the plurality of opaque conductor lines.

In addition to the gate lines and source lines, the thin film transistor layer 290 further includes a plurality of pixel driving circuits 291. Based on a display pixel signal and a display driving signal, the thin film transistor layer 290 drives a corresponding pixel driving circuit 291 so as to proceed with display operation.

According to different designs of the pixel driving circuit 291, such as 2T1C being a pixel driving circuit formed with two thin film transistors and a storage capacitor, and 6T2C being a pixel driving circuit formed with six thin film transistors and two storage capacitors. The gate 2911 of at least one thin film transistor in the pixel driving circuit 291 is connected to a gate line (not shown). According to different designs of driving circuit, a source/drain 2913 of at least one thin film transistor in a control circuit is connected to a source line (not shown) and a source/drain 2915 of at least one thin film transistor in pixel driving circuit 291 is connected to a corresponding anode pixel electrode 281 of the anode layer 280.

The cathode layer 270 is disposed at one side of the over coating layer 260 facing the OLED layer 230 and between the upper substrate 210 and the OLED layer 230. The cathode layer 270 is formed with metal material, preferably metal material with thickness being less than 50 nm. The metal material is selectively to be aluminum, silver, magnesium, calcium, potassium, lithium, indium, their alloy, or combination of lithium fluoride, magnesium fluoride, lithium oxide. Due to the thickness of the cathode layer 270 being less than 50 nm, the light generated by the OLED layer 230 can pass through it, so as to show images on the upper substrate 210. The cathode layer 270 is intact piece electrical connection, so that it can be used as a shielding. Moreover, the cathode layer 270 also receives the current coming from the anode pixel electrode 281.

The anode layer 280 is disposed at one side of the thin film transistor layer 290 facing the OLED layer 230. The anode layer 280 includes a plurality of anode pixel electrodes 281. Each of the anode pixel electrodes 281 is corresponding to one pixel driving transistor of the pixel driving circuit 291 of the thin film transistor layer 290. That is, each of the anode pixel electrodes 281 is connected to a source/drain of the pixel driving transistor of the corresponding pixel driving circuit 291, so as to form a pixel electrode of a specific color, for example a red pixel electrode, a green pixel electrode, a blue pixel electrode, or a white pixel electrode which is adopted in the present invention.

The OLED layer 230 includes a hole transporting layer 231, an emitting layer 233, and an electron transporting layer 235. The OLED layer 230 is preferably emitting white light, and using the color filter layer 250 to filter out and to generate red, blue, green primary colors.

Figure 7:
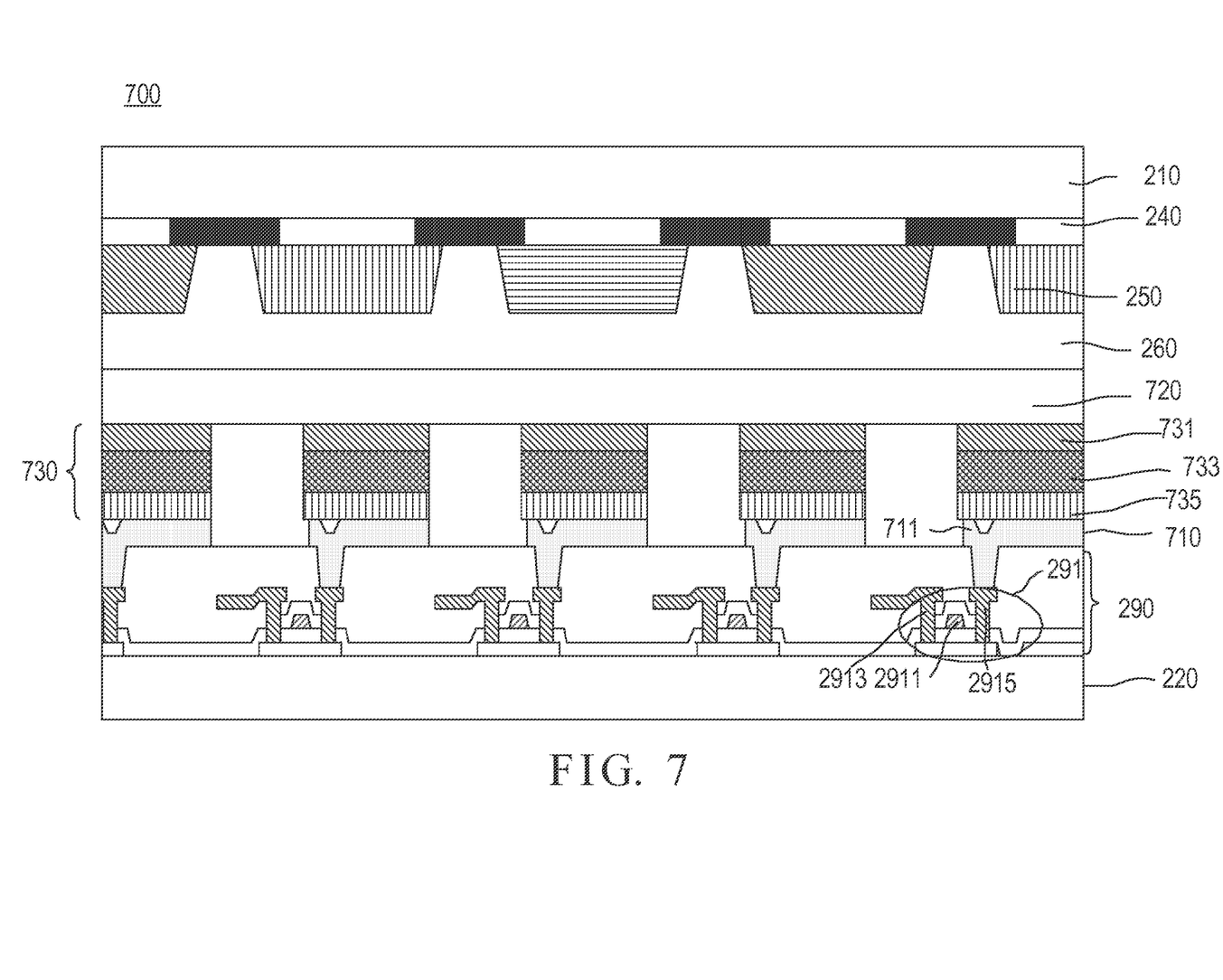
FIG. 7 is another stack-up diagram of the in-cell OLED touch display panel structure in accordance with the present invention.

FIG. 7 is another stack-up diagram of the in-cell OLED touch display panel structure 700 in accordance with the present invention, which is similar to the in-cell OLED touch display panel structure of FIG. 2 except that the positions of the cathode layer 710 and the anode layer 720 are exchanged to each other. The cathode layer 710 includes a plurality of cathode pixel electrodes 711. Each of the cathode pixel electrodes 711 is corresponding to one pixel driving transistor of the pixel driving circuit 291 of the thin film transistor layer 290. That is, each of the cathode pixel electrodes 711 is connected to a source/drain 2915 of the pixel driving transistor of the corresponding pixel driving circuit 291, so as to form a pixel electrode of a specific color, for example a red pixel electrode, a green pixel electrode, a blue pixel electrode, or a white pixel electrode adopted in the present invention.

As shown in FIG. 7, the positions of the cathode layer 710 and the anode layer 720 are exchanged to each other. In order to match with the positions of cathode layer 710 and the anode layer 720, the positions of the hole transporting layer 731 and the electron transporting layer 735 are also exchanged to each other. The cathode layer 710 includes a plurality of cathode pixel electrodes 711. Each of the cathode pixel electrodes 711 is connected to a source/drain 2915 of the pixel driving transistor of the corresponding pixel driving circuit 291.

In view of the foregoing, it is known that the present invention is capable of forming a single-layered touch pattern on the black matrix layer 240, so as to have the following advantages:

1. There is no need to have a sensing electrode layer formed on the upper substrate or lower substrate of the OLED panel, thereby lowering the cost and decreasing the number of manufacturing steps; and 2. In the prior art, the electrode pads made of ITO have an average light penetration rate of about 90%. In the present invention, the N mesh-like polygonal regions 42-1 to 42-N, and N conductive traces 43-1 to 43-N are made of the opaque conductor lines, so that the light penetration rate is not influenced. Therefore, the light penetration rate of the present invention is much better than that of the prior art. Accordingly, in comparison with the prior touch display panel, the in-cell OLED touch display panel structure in accordance with the present invention shall have a higher brightness.

Although the present invention has been explained in relation to its preferred embodiment, it is to be understood that many other possible modifications and variations can be made without departing from the spirit and scope of the invention as hereinafter claimed.

What is claimed is:

1. An in-cell OLED touch display panel structure, comprising:
    an upper substrate;
    a lower substrate parallel to the upper substrate;
    an OLED layer configured between the upper substrate and the lower substrate;
    a black matrix layer disposed at one surface of the upper substrate and facing the OLED layer, the black matrix layer being composed of a plurality of opaque conductor lines; and
    a thin film transistor layer disposed at the surface of the lower substrate facing the OLED layer,
    wherein the plurality of opaque conductor lines are divided into a first group of opaque conductor lines, a second group of opaque conductor lines, and a third group of opaque conductor lines, the second group of opaque conductor lines being formed to be N mesh-like polygonal regions, where N is a positive integer, the opaque conductor lines in any one of the mesh-like polygonal regions being electrically connected together while any two mesh-like polygonal regions are not connected, each polygonal region being a sensor electrode, so as to form a single-layered touch pattern on the black matrix layer;
    wherein the third group of opaque conductor lines is formed to be N conductive traces, each of the N conductive traces being electrically connected to a corresponding mesh-like polygonal region, while any two conductive traces are not connected;
    wherein the first group of opaque conductor lines is not connected to the second group of opaque conductor lines and the third group of opaque conductor lines.

2. The in-cell OLED touch display panel structure as claimed in claim 1, wherein the plurality of opaque conductor lines of the black matrix layer is arranged in a first direction and a second direction.

3. The in-cell OLED touch display panel structure as claimed in claim 2, wherein the first direction is vertical to the second direction.

4. The in-cell OLED touch display panel structure as claimed in claim 3, wherein the mesh-like polygonal region has a shape of triangle, rectangle, square, rhombus, hexagonal, octagon or round.

5. The in-cell OLED touch display panel structure as claimed in claim 4, wherein the plurality of opaque conductor lines of the black matrix are made of conductive metal material or combination of opaque non-conductive material and conductive metal material.

6. The in-cell OLED touch display panel structure as claimed in claim 5, wherein the conductive metal material is selectively to be chromium, barium, aluminum, silver, copper, titanium, nickel, tantalum, cobalt, tungsten, magnesium, calcium, potassium, lithium, indium, their alloy, or combination of lithium fluoride, magnesium fluoride, lithium oxide.

7. The in-cell OLED touch display panel structure as claimed in claim 6, wherein the thin film transistor layer include K gate lines and L source lines for driving corresponding pixel driving transistor and pixel capacitor based on a display pixel signal and a display driving signal, so as to perform a display operation, where K and L are each a positive integer.

8. The in-cell OLED touch display panel structure as claimed in claim 7, wherein the K gate lines and the L source lines are disposed at positions corresponding to those of the plurality of opaque lines of the black matrix layer.

9. The in-cell OLED touch display panel structure as claimed in claim 8, further comprising:
- a color filter layer disposed at one surface of the black matrix layer and facing the OLED layer; and
- an over coating layer disposed on a surface of the color filter.

10. The in-cell OLED touch display panel structure as claimed in claim 9, further comprising:
- a cathode layer disposed at one side of the over coating layer facing the OLED layer; and
- an anode layer disposed at one side of the thin film transistor layer facing the OLED layer, the anode layer including a plurality of anode pixel electrodes, each of the anode pixel electrodes being connected to a source/drain of the pixel driving transistor of a corresponding pixel driving transistor.

11. The in-cell OLED touch display panel structure as claimed in claim 9, further comprising:
- a cathode layer disposed at one side of the thin film transistor layer facing the OLED layer, the cathode layer including a plurality of cathode pixel electrodes, each of the cathode pixel electrodes being connected to a source/drain of the pixel driving transistor of a corresponding pixel driving transistor; and
- an anode layer disposed at one side of the over coating layer facing the OLED layer.

* * * * *